(12) United States Patent
Park et al.

(10) Patent No.: US 7,893,484 B2
(45) Date of Patent: Feb. 22, 2011

(54) SEMICONDUCTOR DEVICE WITH CHARGE STORAGE PATTERN AND METHOD FOR FABRICATING THE SAME

(75) Inventors: Young-Woo Park, Seoul (KR); Jung-Dal Choi, Gyeonggi-do (KR); Jae-Sung Sim, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 1001 days.

(21) Appl. No.: 11/683,383

(22) Filed: Mar. 7, 2007

(65) Prior Publication Data

US 2007/0212880 A1 Sep. 13, 2007

(30) Foreign Application Priority Data

Mar. 9, 2006 (KR) ...................... 10-2006-0022308

(51) Int. Cl.
*H01L 29/792* (2006.01)
(52) U.S. Cl. ............................... 257/324; 257/E29.309
(58) Field of Classification Search ................... 257/324
See application file for complete search history.

(56) References Cited

U.S. PATENT DOCUMENTS

| | | | | |
|---|---|---|---|---|
| 2005/0227435 A1* | 10/2005 | Oh et al. | ...................... | 438/257 |
| 2007/0133292 A1* | 6/2007 | Liao et al. | .............. | 365/185.18 |
| 2007/0200168 A1* | 8/2007 | Ozawa et al. | ................ | 257/324 |
| 2008/0105919 A1* | 5/2008 | Lim et al. | ..................... | 257/324 |
| 2008/0130372 A1* | 6/2008 | Ghodsi | .................. | 365/185.28 |
| 2009/0008704 A1* | 1/2009 | Okamura | ..................... | 257/324 |
| 2009/0221140 A1* | 9/2009 | Lim et al. | ..................... | 438/591 |

FOREIGN PATENT DOCUMENTS

| | | |
|---|---|---|
| JP | 2002-359303 | 12/2002 |
| JP | 2003-078048 | 3/2003 |
| KR | 2003-0008990 | 1/2003 |
| KR | 10-2004-0082334 | 9/2004 |
| KR | 2005-009877 | 10/2005 |
| KR | 10-2005-0106822 | 11/2005 |

OTHER PUBLICATIONS

English language abstract of Japanese Publication No. 2002-359303.
English language abstract of Japanese Publication No. 2003-078048.
English language abstract of Korean Publication No. 2005-009877.

* cited by examiner

*Primary Examiner*—Benjamin P Sandvik
(74) *Attorney, Agent, or Firm*—Myers Bigel Sibley & Sajovec, P.A.

(57) ABSTRACT

A semiconductor device (e.g., a non-volatile memory device) with improved data retention characteristics includes active regions that protrude above a top surface of a device isolation region. A tunneling insulating layer is formed on the active regions. Charge storage patterns (e.g., charge trap patterns) are formed so as to be spaced apart from each other. A blocking insulating layer and a gate are formed on the charge storage patterns.

11 Claims, 4 Drawing Sheets

SEMICONDUCTOR DEVICE WITH CHARGE STORAGE PATTERN AND METHOD FOR FABRICATING THE SAME

CROSS-REFERENCE TO RELATED APPLICATIONS

This patent application claims the benefit of foreign priority to Korean Patent Application No. 2006-22308, filed on Mar. 9, 2006, the entire contents of which are hereby incorporated by reference.

BACKGROUND

1. Field of Invention

Embodiments of the present invention disclosed herein generally relate to semiconductor devices and methods for fabricating the same and, more particularly, to a semiconductor device having charge storage patterns and a method for fabricating the same.

2. Description of the Related Art

Semiconductor devices such as non-volatile memory devices retain stored data even when a power supply is cut off. Also, non-volatile memory devices such as flash memory can perform a program operation in units of pages or multi-bits and an erase operation in units of blocks or sectors, thus providing an improved operation speed. Non-volatile memory devices are widely used in a variety of devices such as digital mobile communication devices, digital cameras, LAN switches, and PC cards for notebook computers.

Non-volatile memory devices are generally classified as a floating gate type and a charge trap type, depending on the type charge storage layer incorporated therein. Floating gate non-volatile memory devices accumulate charges in a floating gate and charge trap non-volatile memory devices accumulates charges in a trap formed in a dielectric layer such as a silicon nitride layer. Floating gate non-volatile memory devices are limited in reducing a cell size and needs high voltages for program and erase operations. On the other hand, the charge trap non-volatile memory device is advantageous for high integration and can operate at low voltage.

Problems related to inter-device isolation, limited active region, and data retention characteristics must be solved to achieve high integration of charge trap memory devices.

FIG. 1 is a gate-direction sectional view of a conventional SONOS non-volatile memory device with extended active regions.

Referring to FIG. 1, the conventional SONOS non-volatile memory device includes a trench isolation layer 15 recessed below an upper surface of a semiconductor substrate 10. Therefore, a side surface of the semiconductor substrate 10 can be used as an active region, thereby forming an extended active region. A tunnel isolation layer 20, a charge trap layer 30, a blocking insulating layer 40 preventing loss of charges and a gate electrode 50 are formed on the extended active region and the isolation layer 15. However, when the distance between adjacent cells is reduced in order to improve the integration of the non-volatile memory device with the extended active region, trapped charges can be transferred between the adjacent cells to change stored data. Moreover, the distance between the adjacent cells is further reduced because the tunnel isolation layer 20, the charge trap layer 30, and the blocking insulating layer 40 are also formed the side surface of the extended active region.

SUMMARY

Exemplary embodiments described herein are adapted to provide semiconductor devices (e.g., non-volatile memory devices) having charge storage patterns (e.g., charge trap patterns) that enhance data retention characteristics, and methods for fabricating the same.

One embodiment exemplarily described herein can be generally characterized as a semiconductor device that includes active regions and a device isolation layer between the active regions, wherein the active regions protrude above a top surface of the device isolation layer. Charge storage patterns are on corresponding ones of the active regions, wherein the charge storage patterns are separated from each other. Tunnel insulating layers are on upper and side surfaces of corresponding ones of the active regions and between corresponding ones of the active regions and the charge storage patterns. A blocking insulating layer is on the charge storage patterns and a gate electrode is on the blocking insulating layer.

Another embodiment exemplarily described herein can be generally characterized as a method for fabricating a semiconductor device. In the method, active regions and device isolation layer between the active regions are formed on a substrate, wherein the active regions protrude above a top surface of the device isolation layer. Tunnel insulating layers are formed on upper and side surfaces of corresponding ones of the active regions. Charge storage patterns are formed on corresponding ones of the tunnel insulating patterns, wherein the charge storage patterns are separated from each other. A blocking insulation layer is formed on the charge storage patterns and a gate electrode is formed on the blocking insulating layer.

Yet another embodiment exemplarily described herein can be generally characterized as a semiconductor device that includes an active region having an upper surface and a side surface. A device isolation layer is adjacent to the side surface of the active region. An upper surface of the device isolation layer is below the upper surface of the active region. A tunnel insulating layer extends contiguously over the upper and side surfaces of the active region. A charge storage pattern is on the tunnel insulating layer and contacts a first portion of the upper surface of the device isolation layer. A blocking insulating layer is on the charge storage pattern and contacts a second portion of the upper surface of the device isolation layer. A gate electrode is on the blocking insulating layer.

BRIEF DESCRIPTION OF THE FIGURES

The accompanying figures are included to provide a further understanding of the present invention, and are incorporated in and constitute a part of this specification. The drawings illustrate exemplary embodiments of the present invention and, together with the description, serve to explain principles of the present invention. In the figures.

DETAILED DESCRIPTION

Figure 1:
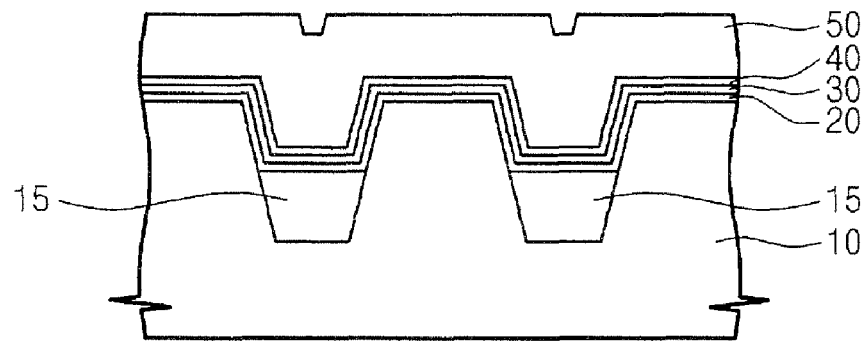
FIG. 1 is a sectional view of a conventional SONOS non-volatile memory device having extended active regions.

Exemplary embodiments will be described below in more detail with reference to the accompanying drawings. These embodiments, however, may be realized in different forms and should not be constructed as limited to the embodiments set forth herein. Rather, these embodiments are provided so that this disclosure will be thorough and complete, and will fully convey the scope of the present invention to those skilled in the art.

In the figures, the dimensions of layers and regions are exaggerated for clarity of illustration. It will also be understood that when a layer (or film) is referred to as being 'on' another layer or substrate, it can be directly on the other layer or substrate, or intervening layers may also be present. Further, it will be understood that when a layer is referred to as being 'under' another layer, it can be directly under, and one or more intervening layers may also be present. In addition, it will also be understood that when a layer is referred to as being 'between' two layers, it can be the only layer between the two layers, or one or more intervening layers may also be present. Like reference numerals refer to like elements throughout.

Exemplary embodiments disclosed herein provide a semiconductor device such as a memory device having charge storage patterns (e.g., a charge trap memory device). Exemplary charge trap memory devices include a silicon/oxide/nitride/oxide/silicon (SONOS) charge trap memory device having an oxide layer, a nitride layer, an oxide layer and a silicon layer that are sequentially stacked on a silicon substrate; a metal/oxide/nitride/oxide/silicon (MONOS) charge trap memory device having an oxide layer, a nitride layer, an oxide layer, and a metal layer that are sequentially stacked on a silicon substrate; and a metal/oxide/nitride/oxide/silicon (MANOS) charge trap memory device having an oxide layer, a nitride layer, an aluminum oxide layer, and a metal layer that are sequentially stacked on a silicon substrate. Accordingly, charge trap memory devices can be generally characterized as having a dielectric layer, which serves as a charge storage layer, between a substrate and a gate electrode.

FIGS. 2 through 7 are sectional views exemplarily illustrating one embodiment of a method of fabricating a semiconductor device having charge storage patterns (e.g., charge trap patterns).

Figure 2:
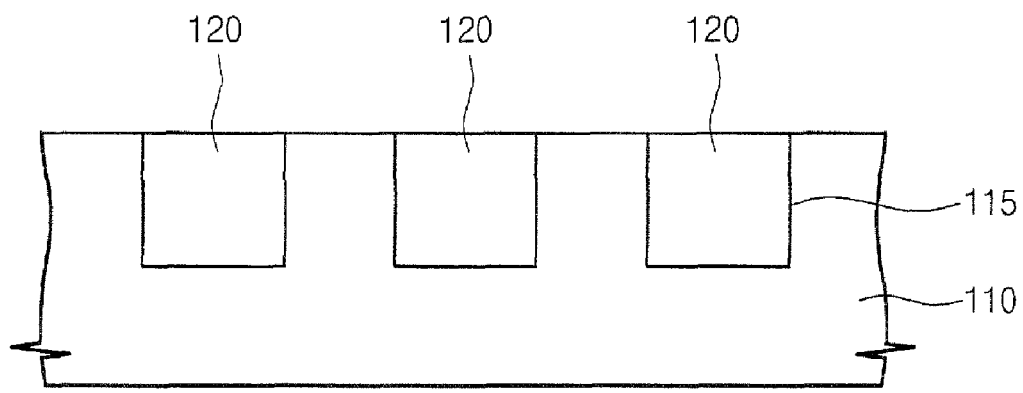
FIGS. 2 through 7 are sectional views exemplarily illustrating one embodiment of a method of fabricating a semiconductor device having charge storage layer patterns.

Referring to FIG. 2, ions may be implanted in a semiconductor substrate 110 to form a well (not shown). Initial device isolation layers 120 are formed on the semiconductor substrate 110 to define active regions therebetween. The initial device isolation layers 120 are formed to have an upper surface that may be substantially flush with the upper surface of the semiconductor substrate 110.

An exemplary method of forming the initial device isolation layers 120 will now be described. To form the initial device isolation layers 120, an oxide layer and a nitride layer (both not shown) may be formed on the semiconductor substrate 110. The oxide layer and the nitride layer may be patterned to form a mask defining an opening for a trench. A trench isolation region 115 with a depth of about 0.2 um to 1.0 um may be formed in the semiconductor substrate 110 using the patterned oxide layer and the patterned nitride layer as a mask. The trench isolation region 115 is then filled with an insulating material. For example, an oxide liner and/or a nitride liner may be formed on an inner wall of the trench isolation region 115. A middle temperature oxide (MTO) layer may then be formed on the oxide liner and/or the nitride liner. The remaining region may then be filled with a material having good gap filling characteristic such as undoped silicate glass (USG) or filled with an oxide material formed according to a high density plasma chemical vapor deposition (HDP-CVD) process. The upper surface of the resulting structure may then be planarized using a chemical mechanical polishing (CMP) process or an etch-back process. The aforementioned patterned nitride layer serves as a stopper of the CMP process or the etch-back process. Portions of the patterned oxide layer and nitride layer remaining on the semiconductor substrate 110 after the planarizing process are then removed to form initial device isolation layers 120 having an upper surface that is slightly higher than or substantially equal to that of the semiconductor substrate 110. After forming the initial device isolation layers 120, an additional thermal treatment may be performed to densify the initial device isolation layers 120 and increase a resistance of the initial device isolation layers 120 against subsequent wet etching processes.

Figure 3:
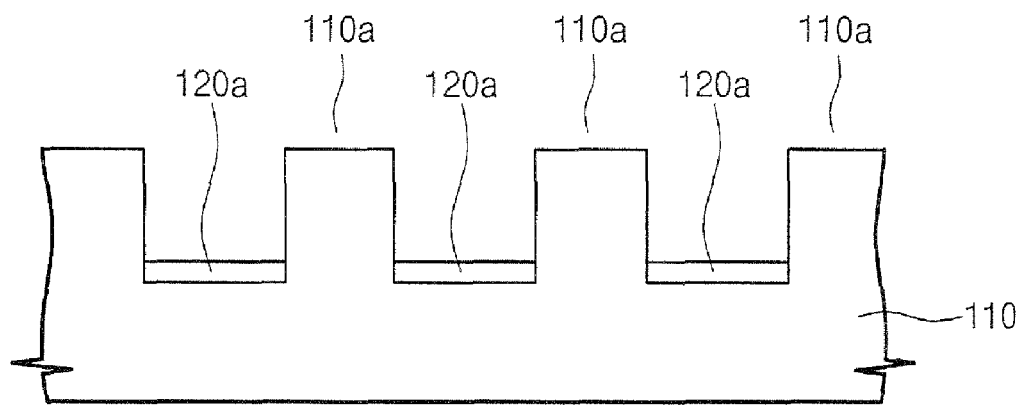

Referring to FIG. 3, the initial device isolation layers 120 are etched, thereby forming device isolation layers 120a and exposing side surfaces of the semiconductor substrate 110. The exposed side surfaces and the upper surface of the semiconductor substrate 110 constitute active regions 110a. Accordingly, the active regions 110a protrude above an upper surface of the device isolation layers 120a. The initial device isolation layers 120 may be etched such that the upper surfaces of the isolation layers 120a are lower than an upper surface of the active regions 110a by, for example, about 500 Å to about 9,000 Å. The initial device isolation layer 120 may be etched using a wet etching process. When the initial device isolation layer 120 contains silicon, the etching process may be performed using an etchant containing a hydrofluoric acid (HF) or a buffered oxide etchant (BOE).

Figure 4:
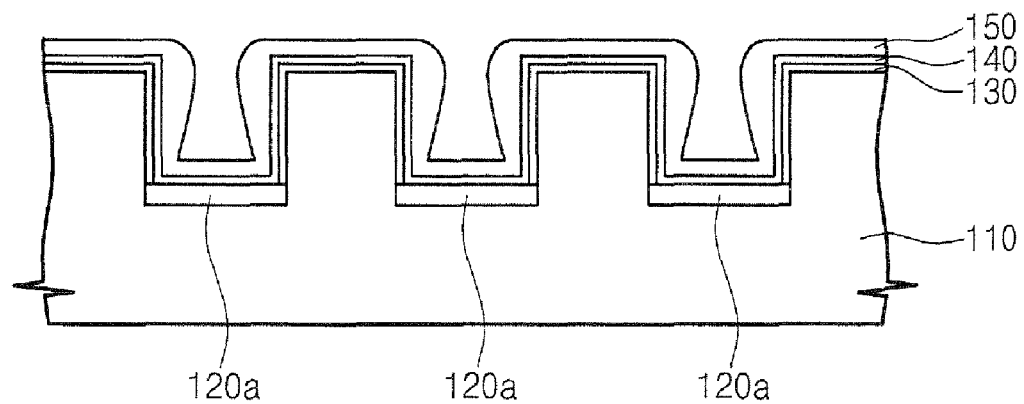

Referring to FIG. 4, tunnel insulating layers 130 and a charge storage (e.g., charge trap) layer 140 are formed on the upper and side surfaces of the active regions 110a and on the isolation layers 120a. The tunnel insulating layers 130 may, for example, include a thermal oxide, an oxide formed according to a chemical vapor deposition (CVD) process or an oxide formed according to an atomic layer deposition (ALD) process. For example, when the tunnel insulating layers 130 include a thermal oxide, the tunnel insulating layers 130 are formed on the upper and side surfaces of the active regions 110a. When the tunnel insulating layers 130 include an oxide formed according to CVD or ALD processes, the tunnel insulating layers 130 are formed on the device isolation layer 120a as well as on the active regions 110a. The charge storage layer 140 may, for example, include a high-k dielectric layer, carbon nanotubes, nano-crystals or quantum dots or combinations thereof. The high-k dielectric layer may include, for example, silicon nitride (SiN), aluminum oxide (AlO), hafnium oxide (HfO), hafnium-aluminum oxide (HfAlO), hafnium-silicon oxide (HfSiO), or the like or combinations thereof.

A mask layer 150 is formed on the charge storage layer 140 and may have a different thickness corresponding to the regions of the charge storage layer 140 where the mask layer 150 is formed. For example, the mask layer 150 is relatively thinly formed on the isolation layers 120a and relatively thickly formed on the side surfaces of the protruded active regions 110a. The different thickness in each region may be implemented by forming the mask layer 150 under the process conditions that produce a film having relatively poor step coverage. That is, the mask layer 150 is formed under process conditions that produce a film having relatively poor step coverage so that overhang portions of the mask layer 150 are formed at an upper portion of the protruded active region 110a. The mask layer 150 may be formed using a process such as evaporation or sputtering process to produce a film having relatively poor step coverage. The mask layer 150 may also be formed using a CVD process where temperature and pressure are reduced to produce a film having relatively poor step coverage. Alternatively, the mask layer 150 may be formed using a plasma enhanced CVD (PE-CVD) that has a poorer step coverage than a thermal CVD process. The mask layer 150 may be formed of a material having an etch selectivity with respect to the charge storage layer 140. For example, when the charge storage layer 140 includes silicon nitride, the mask layer 150 may include a material such as silicon oxide ($SiO_2$).

Figure 5:
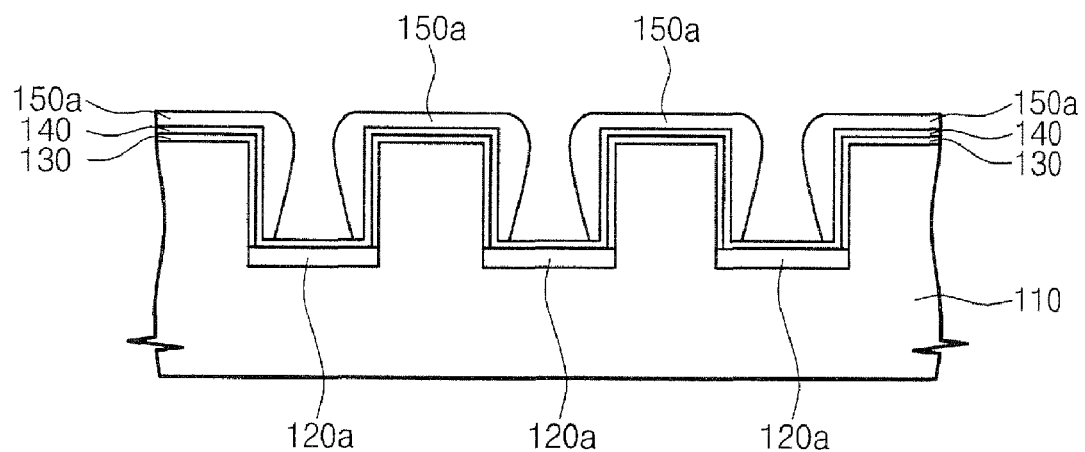

Referring to FIG. 5, the mask layer 150 is subject to a blanket etch to remove portions of the mask layer 150 on the upper surface of the isolation layer 120a. As a result of the blanket etch, the mask layer patterns 150a are formed to expose portions of the charge storage layer 140 on the isolation layers 120a. The mask layer 150 may be etched using a dry etching process. The mask layer 150 is thicker on the upper and side surfaces of the active region 110a than on the upper surface of the isolation layer 120a. Therefore, portions of the mask layer 150 remain on the upper and side surfaces of the active region 110a when a portion of the mask layer 150 is removed from the upper surface of the isolation layer 120a.

Figure 6:
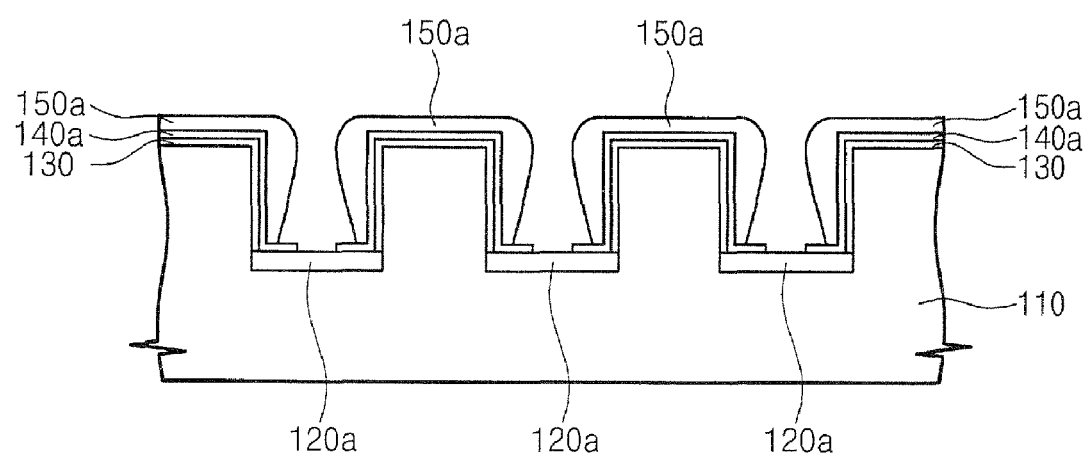

Referring to FIG. 6, the exposed charge storage layer 140 on the device isolation layer 120a is removed, using the mask layer patterns 150a as an etch mask, to form charge storage patterns 140a. The charge storage layer 140 may be etched until the upper surfaces of the isolation layers 120a are exposed. Each of the charge storage patterns 140a are formed on respective ones of the active regions 110a and adjacent charge storage patterns 140a are separated each other. The charge storage patterns 140a of adjacent cells are physically and electrically separated from each other between adjacent active regions.

Figure 7:
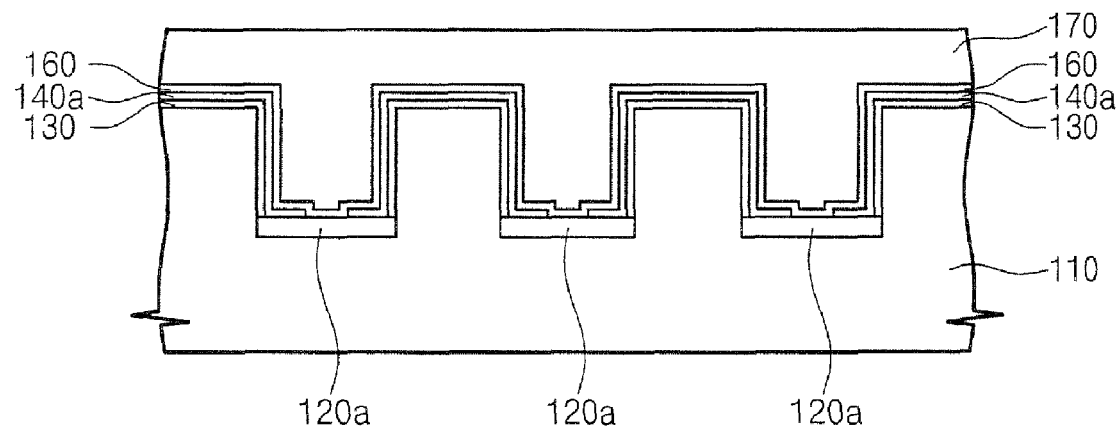

Referring to FIG. 7, the mask layer patterns 150a are removed to expose the charge storage patterns 140a on the upper and side surfaces of the active regions 110a. A blocking insulating layer 160 and a gate electrode 170 are formed on the charge storage patterns 140a and on a portion of the device isolation layer 120a. The mask layer patterns 150a may be removed, for example, by performing a wet etching process, a dry etching process or a combination thereof. The blocking insulating layer 160 may include a material such as silicon oxide (SiO), AlO, HfO, HfAlO, or HfSiO. The gate electrode may include a material such as tantalum nitride (TaN), titanium nitride (TiN), tungsten nitride (WN), tungsten (W), hafnium nitride (HfN), tungsten silicide (WSi), cobalt silicide (CoSi), or combinations thereof.

As exemplarily described above, charge storage layer patterns 140a formed on the tunnel insulating layer 130 are separated from each other over the isolation layer 120a (e.g., along a gate direction) to prevent the transfer of trapped charges between adjacent cells. Therefore, the characteristics (e.g., data retention characteristics) of the semiconductor device can be improved over such characteristics of the conventional art described above.

In one embodiment, the charge storage layer 130 can be selectively exposed by the mask layer patterns 150a, which can be simply formed according to a deposition and blanket etch process, without the need of performing a photolithography process. In another embodiment, however, the charge storage layer 130 can be selectively exposed by a mask layer formed according to a photolithography process.

In another embodiment, the mask layer 150 may be formed after the blocking insulating layer 160 has been formed. In such an embodiment, the mask layer 150 may include a material having an etch selectivity with respect to the blocking insulating layer and the charge storage layer.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A semiconductor device, comprising:
   a device isolation layer formed on a semiconductor substrate, the device isolation layer defining active regions of the semiconductor substrate that protrude above an upper surface of the device isolation layer;
   charge storage patterns on corresponding ones of the active regions, wherein the charge storage patterns are separated from each other;
   tunnel insulating layers on upper and side surfaces of corresponding ones of the active regions;
   a gate electrode on the charge storage patterns; and
   a blocking insulating layer that covers the device isolation layer such that the gate electrode is precluded from contact with the device isolation layer and the tunnel insulating layers,
   wherein the device isolation layer includes a material that is different from a material of the blocking insulating layer and a material of the tunnel insulating layers.

2. The device of claim 1, wherein the blocking insulating layer is disposed between the charge storage patterns and the gate electrode.

3. The semiconductor device of claim 2, wherein the blocking insulating layer contacts a portion of the device isolation layer between adjacent charge storage patterns.

4. The semiconductor device of claim 1, wherein the tunnel insulating layers extend to a portion of the upper surface of the device isolation layer.

5. The semiconductor device of claim 1, wherein the upper surface of the device isolation layer is about 500 Å to about 9000 Å below the upper surface of the active regions.

6. The semiconductor device of claim 1, wherein the charge storage patterns comprise a high-k dielectric material.

7. The semiconductor device of claim 6, wherein the high-k dielectric material comprises SiN, AlO, HfO, HfAlO, HfSiO or combinations thereof.

8. The semiconductor device of claim 1, wherein the charge storage patterns comprise nano-crystals, carbon nanotubes, quantum dots or combinations thereof.

9. The semiconductor device of claim 1, wherein the charge storage patterns are on the upper and side surfaces of corresponding ones of the active regions.

10. The semiconductor device of claim 1, wherein the charge storage patterns extend to a portion of the device isolation layer.

11. A semiconductor device, comprising:
   an active region of a semiconductor substrate, the active region having an upper surface and a side surface;
   a device isolation layer adjacent to the side surface of the active region, wherein an upper surface of the device isolation layer is below the upper surface of the active region;
   a tunnel insulating layer extending contiguously over the upper and side surfaces of the active region;
   a charge storage pattern on the tunnel insulating layer, the charge storage pattern contacting a first portion of the upper surface of the device isolation layer;
   a blocking insulating layer on the charge storage pattern, the blocking insulating layer contacting a second portion of the upper surface of the device isolation layer; and a gate electrode on the blocking insulating layer,
wherein the blocking insulating layer covers the device isolation layer such that the gate electrode is precluded from contact with the device isolation layer and the tunnel insulating layer, and wherein the device isolation layer includes a material that is different from a material of the blocking insulating layer and a material of the tunnel insulating layer.

* * * * *